(12) United States Patent
Lewis

(10) Patent No.: US 7,607,005 B1
(45) Date of Patent: Oct. 20, 2009

(54) VIRTUAL HARDWARE SYSTEM WITH UNIVERSAL PORTS USING FPGA

(75) Inventor: Shane Lewis, Coolidge, AZ (US)

(73) Assignee: RMT, Inc., Tempe, AZ (US)

( * ) Notice: Subject to any disclaimer, the term of this patent is extended or adjusted under 35 U.S.C. 154(b) by 412 days.

(21) Appl. No.: 11/317,221

(22) Filed: Dec. 22, 2005

Related U.S. Application Data

(60) Provisional application No. 60/638,711, filed on Dec. 22, 2004.

(51) Int. Cl.
- G06F 9/00 (2006.01)
- G06F 1/24 (2006.01)
- H03K 17/693 (2006.01)
- H03K 19/00 (2006.01)

(52) U.S. Cl. .................. 713/100; 713/1; 716/16; 716/17

(58) Field of Classification Search .............. 713/1, 713/2, 100; 716/16, 17
See application file for complete search history.

(56) References Cited

U.S. PATENT DOCUMENTS

| | | | | |
|---|---|---|---|---|
| 5,734,872 | A * | 3/1998 | Kelly | 703/20 |
| 5,887,165 | A * | 3/1999 | Martel et al. | 713/100 |
| 5,995,744 | A * | 11/1999 | Guccione | 703/23 |
| 6,775,760 | B1 | 8/2004 | Shigeki | |
| 6,938,177 | B1 * | 8/2005 | Blemel | 713/500 |
| 7,139,995 | B1 * | 11/2006 | James-Roxby et al. | 716/16 |
| 2002/0108009 | A1 * | 8/2002 | Borgatti et al. | 710/303 |
| 2004/0048668 | A1 * | 3/2004 | Brosnan | 463/42 |

FOREIGN PATENT DOCUMENTS

| | | |
|---|---|---|
| JP | 8316329 | 11/1996 |
| JP | 2003241975 | 8/2003 |

\* cited by examiner

*Primary Examiner*—Mark Connolly
*Assistant Examiner*—Stefan Stoynov
(74) *Attorney, Agent, or Firm*—Caesar, Rivise, Bernstein, Cohen & Pokotilow, Ltd.

(57) ABSTRACT

Particular implementations are particularly useful in providing a system in which the hardware is more easily upgradable and new hardware functionality may be added without adding any new physical hardware. Through placement of an FPGA closely associated with the CPU of a personal computer, the FPGA may be reconfigured to act as new hardware. A system for installing new virtual hardware involves loading firmware into memory associated with the FPGA and reconfiguring the FPGA through a microcontroller. Particular implementations include universal ports associated with the FPGA into which adapter plugs can be placed to quickly adapt to any device that may be added through the virtual hardware use of the FPGA. Other implementations include high density connectors into which a plurality of ports of varying configurations may be plugged for connection of external electronic equipment through the FPGA.

20 Claims, 13 Drawing Sheets

VIRTUAL HARDWARE SYSTEM WITH UNIVERSAL PORTS USING FPGA

CROSS REFERENCE TO RELATED APPLICATIONS

This application claims priority to a United States provisional patent application by Lewis entitled "ROGUE COMPUTER AND HANDHELD GAMING SYSTEM," Ser. No. 60/638,711, filed on Dec. 22, 2004, the disclosure of which is hereby incorporated herein by reference.

BACKGROUND

1. Technical Field

Aspects of this disclosure relate generally to acceleration of computer processes and significantly simplified computer hardware upgrades through the use of FPGA ("Field Programmable Gate Array"). Aspects relate more specifically to implementations of a computer, and in specific implementations a personal computer or a handheld gaming system computer, using virtual hardware enabled by the FPGA and a system and method for upgrading a computer's hardware through an on-line system.

2. Background Art

Video game software taxes computing system resources faster than any other software market segment. Programs such as presentation, word processing, spreadsheet email, database and even most multimedia software do not utilize computer processor resources to their design limits as much as most state of the art video game software. System processors can only execute instructions in a sequential order (linearly) and typically only one instruction per clock cycle. FIG. 1 illustrates a typical central processing unit ("CPU") process loop 2 to emphasize the linear nature of the different types of processes that are evaluated and a possible sequence for those processes. Computer owners who desire more advanced software typically are required to replace portions of the hardware of their computers to enjoy the benefits of the newest software advances. The software limitations caused by processor utilization limits require programs to be less complicated and limited the detail of visual data possible. Programs which encroach on a processor's average limited idle time risk program lags. Lags generally result in a delayed drawing and/or movement of visual data and pose a severe limitation to what technology could offer in terms of game software.

Over the past decade, the use of Visual Processor Units ("VPU") has become standard in most personal computers. The VPU is a circuit separate from the CPU ("Central Processing Unit") that handles much of the video analysis and drawing for 2D and 3D visual displays. This ability of a CPU to offload video processes to a VPU resulted in a significant advance in the ability of computers to process video signals and significantly increased the overall computer processing speed. Processes such as 2D and 3D work and transformations, lighting, triangle setup and clipping, rendering and monitor driving (RAMDAC) could now be handled by a separate process cycle in separate hardware. This enabled more aggressive detail in game capability due to greater CPU process cycle 2 time availability. FIG. 2 illustrates the cycle time that is freed up by transferring graphics duties to a VPU process cycle 6 from the CPU process cycle 4. Prior to VPUs, the CPU was responsible for processing essentially all processes for the computer. However, even conventional VPUs still process linearly within the VPU.

Tablet PCs with touch control and handwriting recognition was introduced and offered increased user functionality over conventional LCD monitors. A touch panel virtually eliminates the need for other external input devices such as a keyboard or mouse for normal use. However, the new touch sensitive interface further stresses CPU resources as its complicated algorithms of converting touch, drag and single point taps into commands that the processor and operating system can understand. Additional time for these tasks adds to the overall loading on a CPU process. This can further exacerbate program lag and tax processor capability. Video games for tablet PCs are not currently recommended due to the increased CPU overhead required.

FIG. 3 illustrates yet another example of offloading of typical CPU processes 8 to a VPU process 10 used in a touch screen computer application such as a Tablet PC. The handwriting recognition and touch control processes use CPU process 8 cycle time such that the total CPU process 8 cycle is almost full even with the graphics tasks offloaded to the VPU process cycle 10.

It is also known to include a field programmable gate array ("FPGA") to substitute for certain predetermined processes as disclosed in U.S. Pat. No. 6,775,760 to Shigeki (issued Aug. 10, 2004), the disclosure of which is hereby incorporated herein by reference.

Other separate dedicated computer circuits have also been added to computers to further relieve the CPU by allowing it to offload processes as well. These additional circuits are typically added to a desktop, mobile or personal computers in the form of a separate computer board or "card" coupled to the motherboard through an available PCI ("peripheral computer interconnect") port. For example, sound cards, handwriting recognition cards, Firewire signal processing cards, joystick cards, and the like. Any type of device connection that the computer was not originally designed to receive must be added through a separate module that is somehow attached to the motherboard. This additional hardware is costly, is typically something that the ordinary computer user cannot install without professional help, and due to the cost and difficulty often results in the computer user simply replacing the entire system with one with the desired capability built-in rather than paying someone to physically upgrade the hardware for their existing system.

SUMMARY

Some aspects of this disclosure relate to methods and systems for upgrading personal computer hardware through use of "virtual hardware" firmware programs and an FPGA associated with the CPU of the personal computer. Other aspects of the disclosure relate to generic connector configurations to associate new connector capability with existing hardware and new virtual hardware capabilities.

In particular implementations, an FPGA is coupled to a CPU and may include a microcontroller and associated memory, such as flash memory. Through downloading of firmware programs configured for automatic reconfiguration of the FPGA once initiated by the end user, the end user may literally upgrade the hardware of the system without replacing any of the components of the system. The firmware modifies the configuration of the logic gates within the FPGA so that at least a portion of the FPGA acts like a different piece of hardware. The differently configured FPGA may include upgraded functionality and/or additional functionality.

In particular implementations, the personal computer is a handheld gaming system. In more particular implementations, the personal computer includes a touch screen display. Firmware may be downloaded to the FPGA through a disk drive or hard drive associated with the personal computer, or may be downloaded through a network connection, such as a local area network, wide area network or Internet connection, associated with the personal computer.

In particular implementations, universal or generic ports are coupled to the FPGA and configured to receive adapters that are configured to couple to the generic port and one or more electronic devices.

In particular implementations, the FPGA may be mounted on the motherboard of the personal computer with the CPU. In other particular implementations, the FPGA may be mounted on a separate circuit board and coupled to the CPU, such as through a peripheral computer interconnect (PCI). In still other particular implementations, the FPGA may be mounted on a separate circuit board and both the FPGA board and the motherboard may be coupled together through being mounted on a third circuit board.

These general and specific aspects may be implemented using a system, a method, and/or a computer program and electronic equipment, or any combination of systems, methods, and/or computer programs and electronic equipment. Additionally, the foregoing and other aspects, features, and advantages will be apparent from the DESCRIPTION and DRAWINGS, and from the CLAIMS.

BRIEF DESCRIPTION OF THE DRAWINGS

Implementations will hereinafter be described in conjunction with the appended DRAWINGS, where like designations denote like elements, and.

DESCRIPTION

As discussed above, implementations of particular aspects in this disclosure may relate to systems and methods for personal computers and for quickly upgrading the hardware of those computers without the requirement of replacing the hardware. Other implementations may relate to handheld game systems. Some aspects relate to all implementations and others relate to only some.

As used herein, the term "personal computer" includes what is typically referred to in the art as desktop computers, laptop computers, tablet computers, mobile computers, and the like. "Personal computer" is not intended to be limited specifically to computers for home use or game use, but is intended to include business desktop, laptop, tablet and mobile computers as well. Personal computers, however, are distinguished from mainframe computers and other large specialty computers and servers that are not personal computers.

Figure 1:
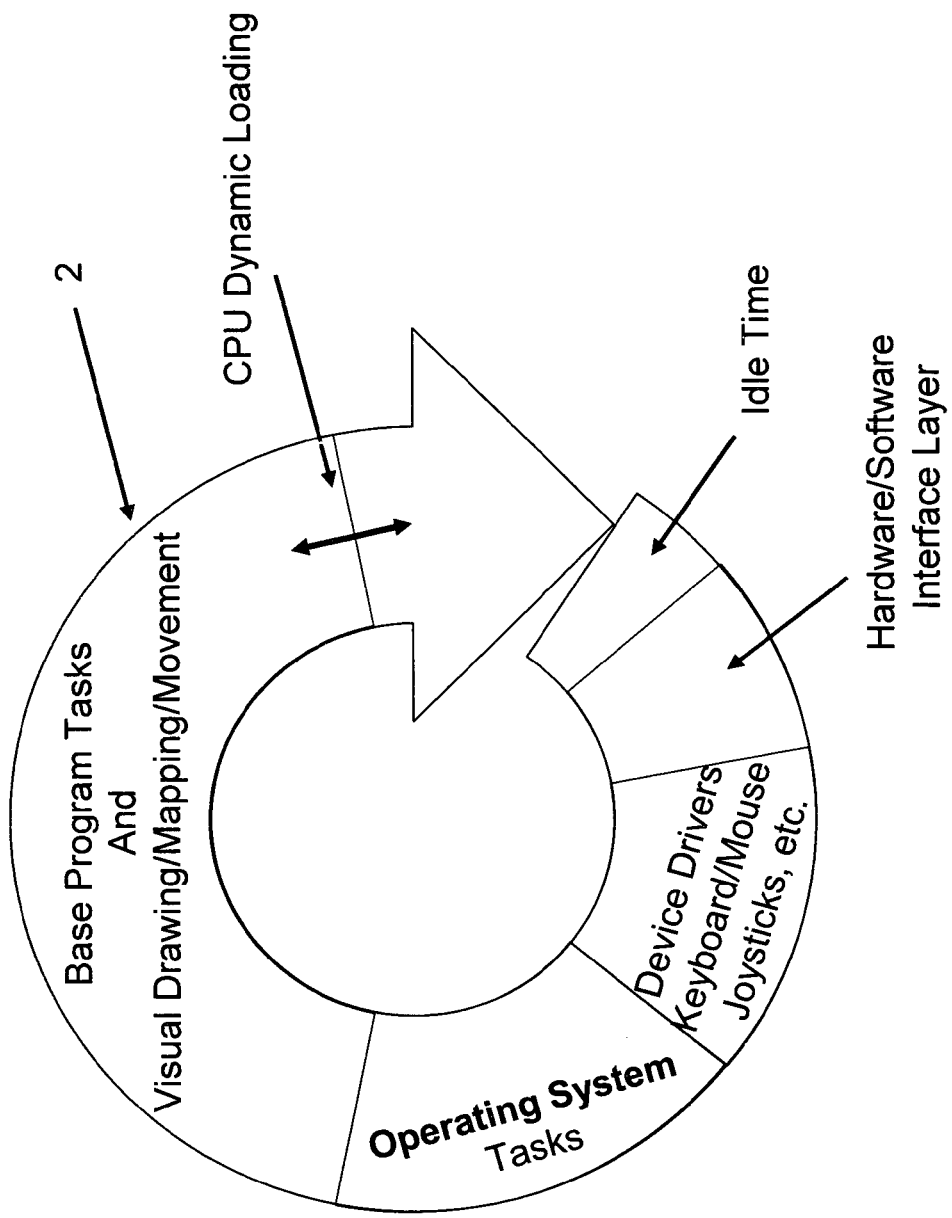
FIG. 1 is an illustration of a conventional CPU process cycle loop.
Figure 2:
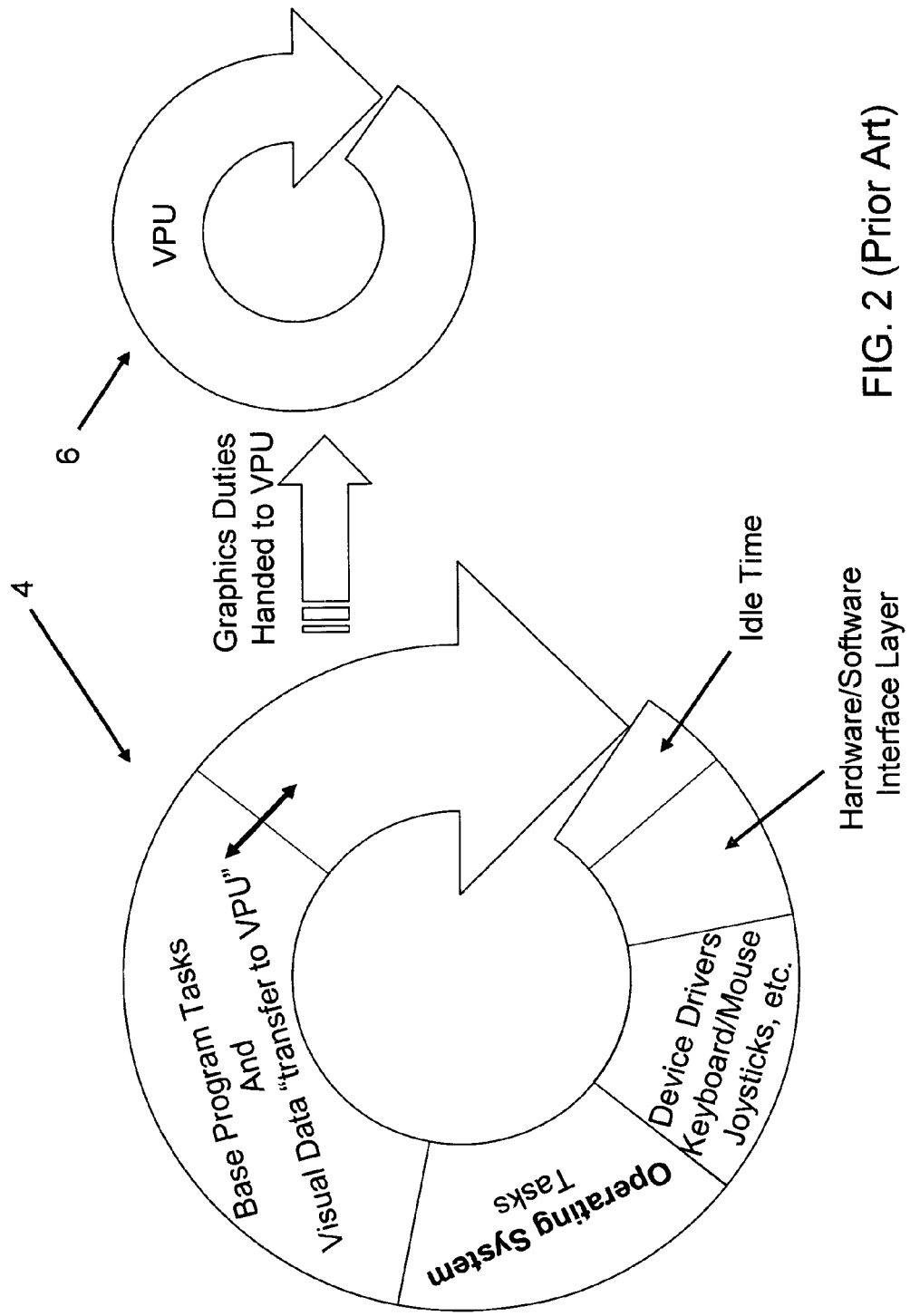
FIG. 2 is an illustration of a conventional CPU process cycle loop with an associated VPU process cycle loop.
Figure 3:
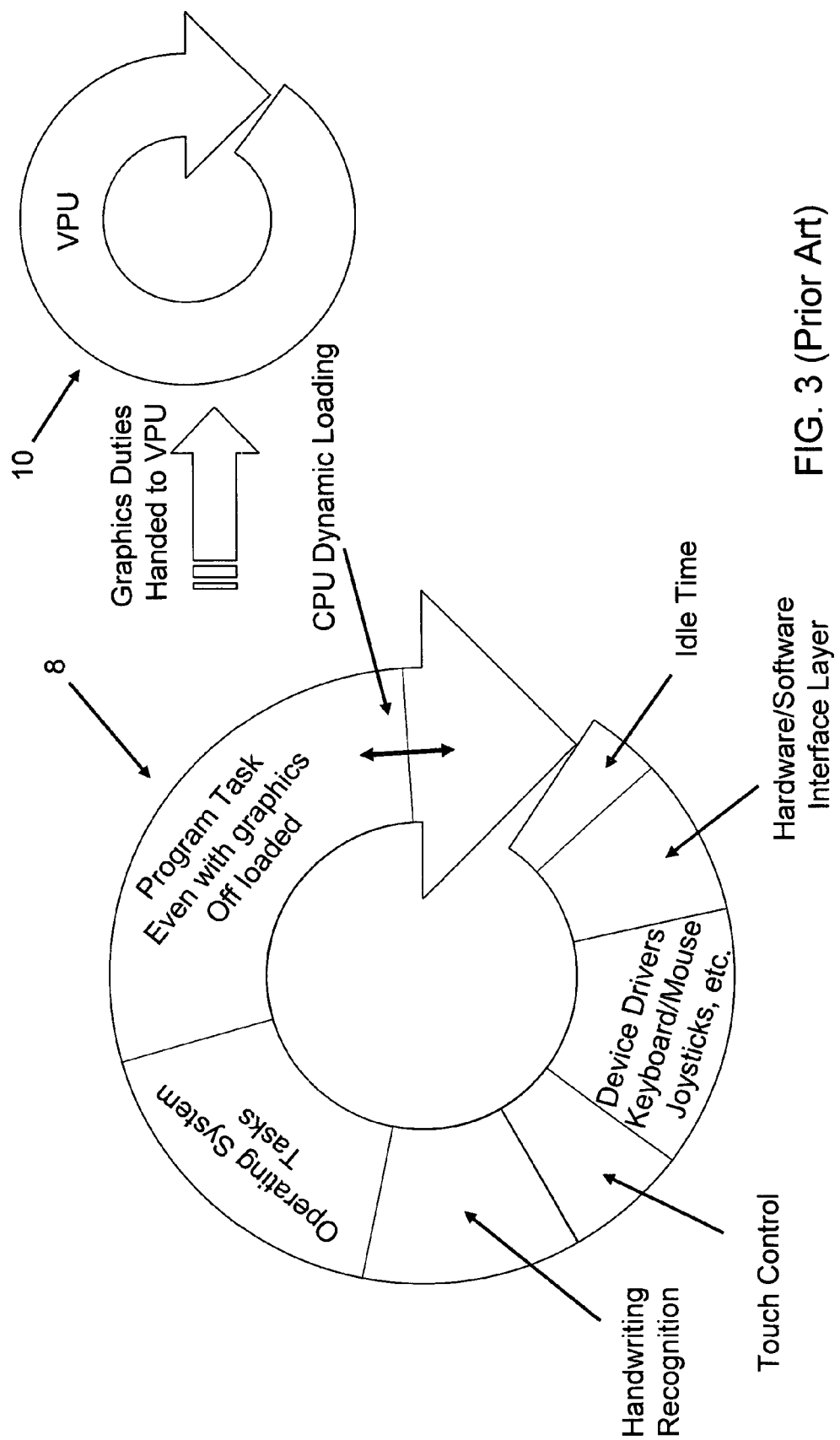
FIG. 3 is an illustration of a conventional CPU process cycle loop with an associated VPU process cycle loop for a pen tablet computer.
Figure 4:
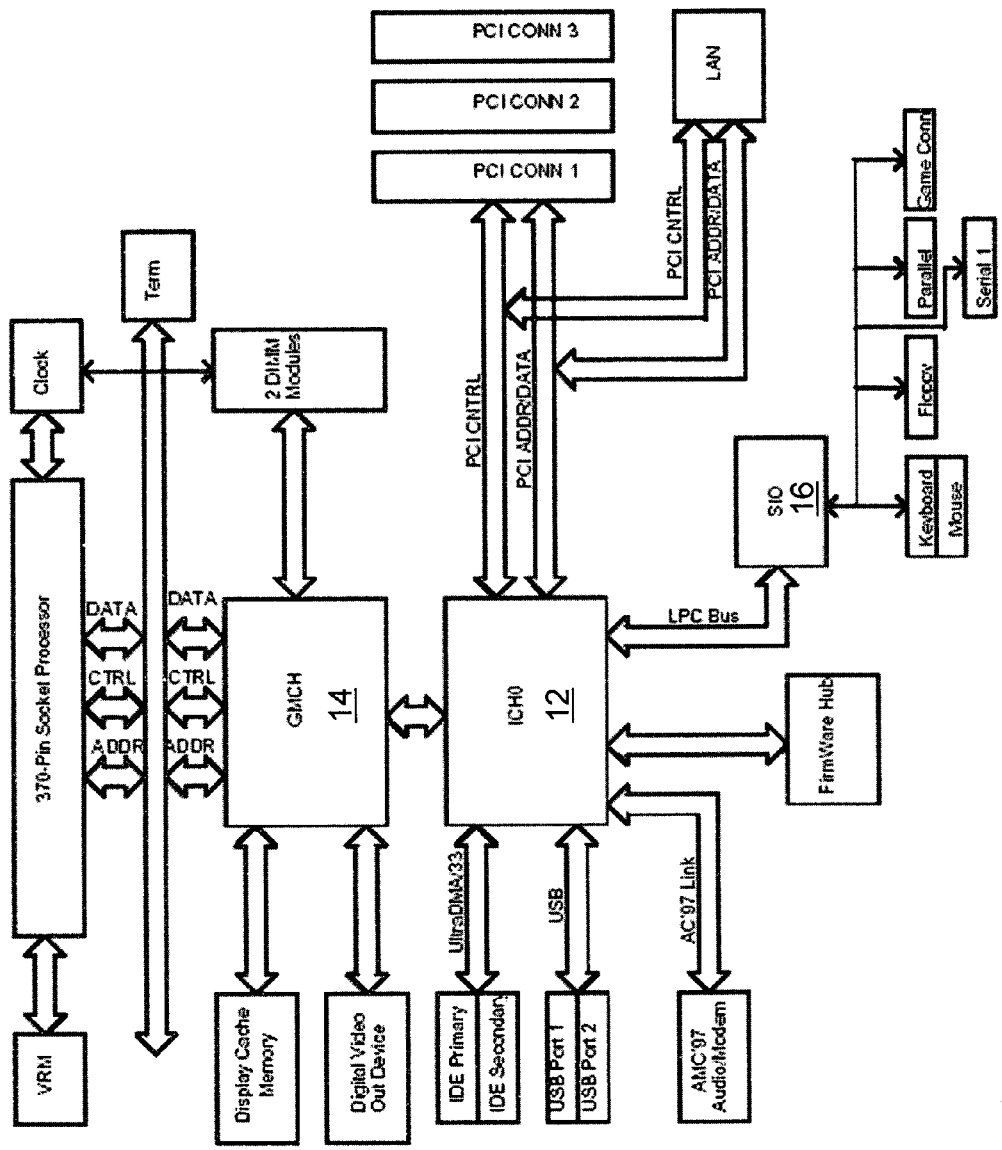
FIG. 4 is a block diagram of a traditional PC motherboard.

FIG. 4 is a block diagram of a conventional mother board layout for a personal computer. Conventionally, the input/output ("I/O") configuration for data transfer, or the "port configuration" is handled by two devices. The primary device for port control is the "south bridge" 12. The south bridge 12 is one of two components that make up the CPU chipset on most computers. The "north bridge" 14 is the other component. The north bridge 14 in the CPU chipset typically controls the processor, video card, system memory, and the processor itself. The south bridge 12 handles the hard drives, universal serial bus ("USB") ports, network connections, peripheral computer interconnect ("PCI") and/or PCI Express ("PCIE") interface. A third device, called the super I/O chip 16, handles old standard I/O ports often called "legacy ports" such as PS/2 keyboard and mouse, floppy drive, parallel port, serial port, and game controller.

The term "virtual hardware" refers to add on peripherals for personal computers that do not occupy physical circuit board space, but instead exist as firmware in a programmable device such as a field programmable gate array ("FPGA"). The FPGA may be designed as part of the main board ("motherboard") design or separately coupled to the motherboard through an interface to the motherboard. Conventional personal computers ("PC"s) include many different types of external connections. Examples of some of the known connection standards include, but are not limited to, PCI, PCIE, USB, Firewire, and many others.

Figure 5:
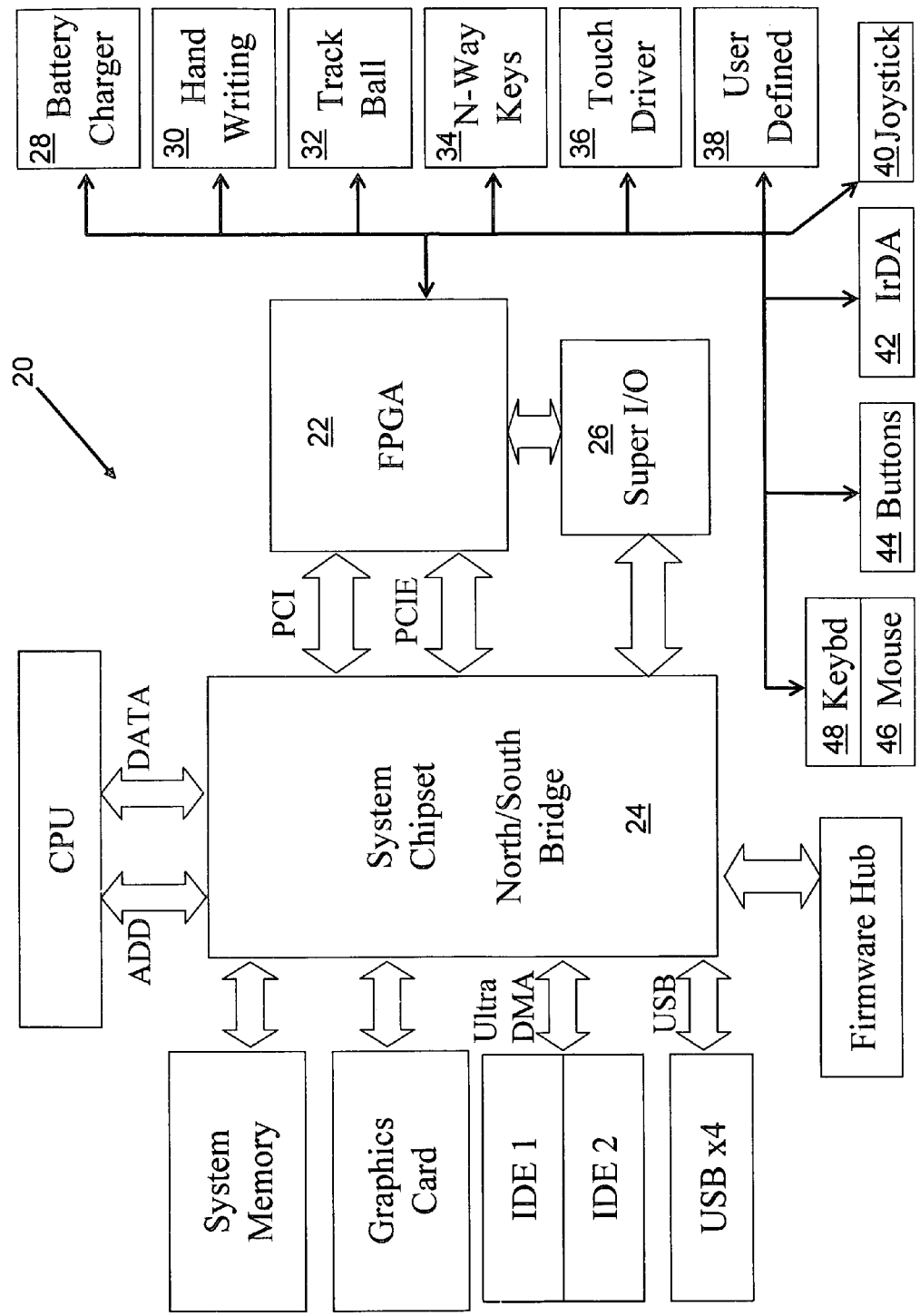
FIG. 5 is a block diagram of an implementation of a personal computer coupled with an FPGA associated with the motherboard.

FIG. 5 is a block diagram of a particular implementation of a virtual hardware capable system 20 having a highly configurable programmable logic, such as a FPGA, associated with the motherboard. Although FPGAs are used in the examples provided in this disclosure, other highly configurable programmable logic devices may also be used. Some examples of other highly configurable programmable logic devices that may be substituted for the FPGA designs include, but are not limited to, programmable logic devices ("PLD") and complex PLD ("CPLD"). Those of ordinary skill in the art will readily be able to adapt the present FPGA designs and implementations discussed herein for use with PLD or CPLD designs from the disclosure and principles made herein.

The FPGA 22 of the implementation of FIG. 5 is coupled through the PCI and PCIE interconnects to the system chipset 24 and directly to the super I/O 26. Some examples of peripheral devices 28-48 that may be coupled to the personal computer through the FPGA 22 are shown in FIG. 5. These are understood to be examples and do not limit the extent of other peripheral devices that may also be coupled through the FPGA 22. By handing over a portion or all of the I/O control for peripheral devices and external connections to the FPGA 22, a PC design can be flexible enough to add capabilities without the need to plug in new devices into the ports. Routing some of the ports from the super I/O chip 26 or chip set 24 to the I/O can allow the end user to create "virtual hardware" or "virtual circuit cards" that appear to the system as hardware that has been physically added, but instead is simply implemented as logic inside the FPGA.

By example, to upgrade conventional PC hardware with features not already designed on the motherboard itself requires the user to purchase a circuit card with the desired functionality designed to interconnect to the PC via one of the many port interconnect methods, such as the PCI port. As a specific example, a 1394 Firewire PCI circuit card includes a PCI interface and a 1394 interface and PCI bridge. The circuit card is designed to add either additional Firewire ports to a PC or add a 1394 interface to a PC that does not currently have the interface at all. This is done by plugging the card into one of the motherboard's PCI slots and loading the appropriate software driver so that the PC can communicate with the new piece of hardware.

Through the use of programmable logic in association with the motherboard, such as through the example shown in FIG. 5, new capabilities can be added to the motherboard that did not previously exist on the motherboard at all. The programmable logic, such as an FPGA, adds an extensive capacity for new hardware configurations through the FPGA without replacing or adding any hardware. In the implementation shown in FIG. 5, the FPGA would serve as the heart of the I/O control system. It can be updated or altered through a CD, DVD or other drive associated with the PC, or through a download such as from the Internet or other network associated with the PC. The FPGA is a "quasi" hardware device where a special descriptive language known as Very High Speed Integrated Circuits Hardware Description Language ("VHDL" or "VHSIC HDL").

FPGAs are programmable logic components that can be programmed to duplicate the functionality of basic logic gates, such as AND, OR, XOR, INVERT) or more complex combinatorial functions such as decoders or simple math functions. In most FPGAs, these programmable logic components, or logic blocks, also include memory elements which may consist of simple flip-flops or more complete blocks of memory. The hierarchy of programmable interconnects allows the logic blocks of an FPGA to be interconnected as needed by the system designer similar to a one-chip programmable breadboard. These logic blocks and interconnects can be programmed after the manufacturing process by the customer/designer so that the FPGA can perform whatever new logical function is needed after the product has been shipped. The FPGA provides additional flexibility such as the ability to re-program in the field to fix bugs, and to lower non-recurring engineering costs on new design standards that fit within the realm of the switching capability of the FPGA itself.

By including an FPGA in close association with the CPU of a PC, the existing hardware of the PC is enhanced by the FPGA. The FPGA can now perform functions that would normally require a completely new circuit card to handle those functions; by building those functions into their own separate and independently executed processes called "state machines" within the logic cells of the FPGA. In fact, because the functionality is created on the device in real circuits, each of the individual state machines can all execute in parallel on a single clock cycle. Unlike traditional PCs that use a single processor to execute software instructions sequentially, each process or state machine inside the FPGA can be executed simultaneously as complete independent processes.

For instance, handwriting recognition software running on a conventional PC will first determine if a valid letter was drawn and then determine which letter was drawn by comparing the drawing recorded to memory with its own alphabet. Each compare is done sequentially requiring a multitude of instruction executions in order to complete the task. The same capability implemented as configured logic within the FPGA could perform the same check against the entire alphabet all at once, or in the same time it takes the standard sequential processor to execute a single instruction. This ability to transfer system level functions normally executed by a processor to the FPGA greatly expands the number of cycles available for the processor to concentrate on application instructions. This increased capacity is significantly useful in executing PC games.

Figure 6:
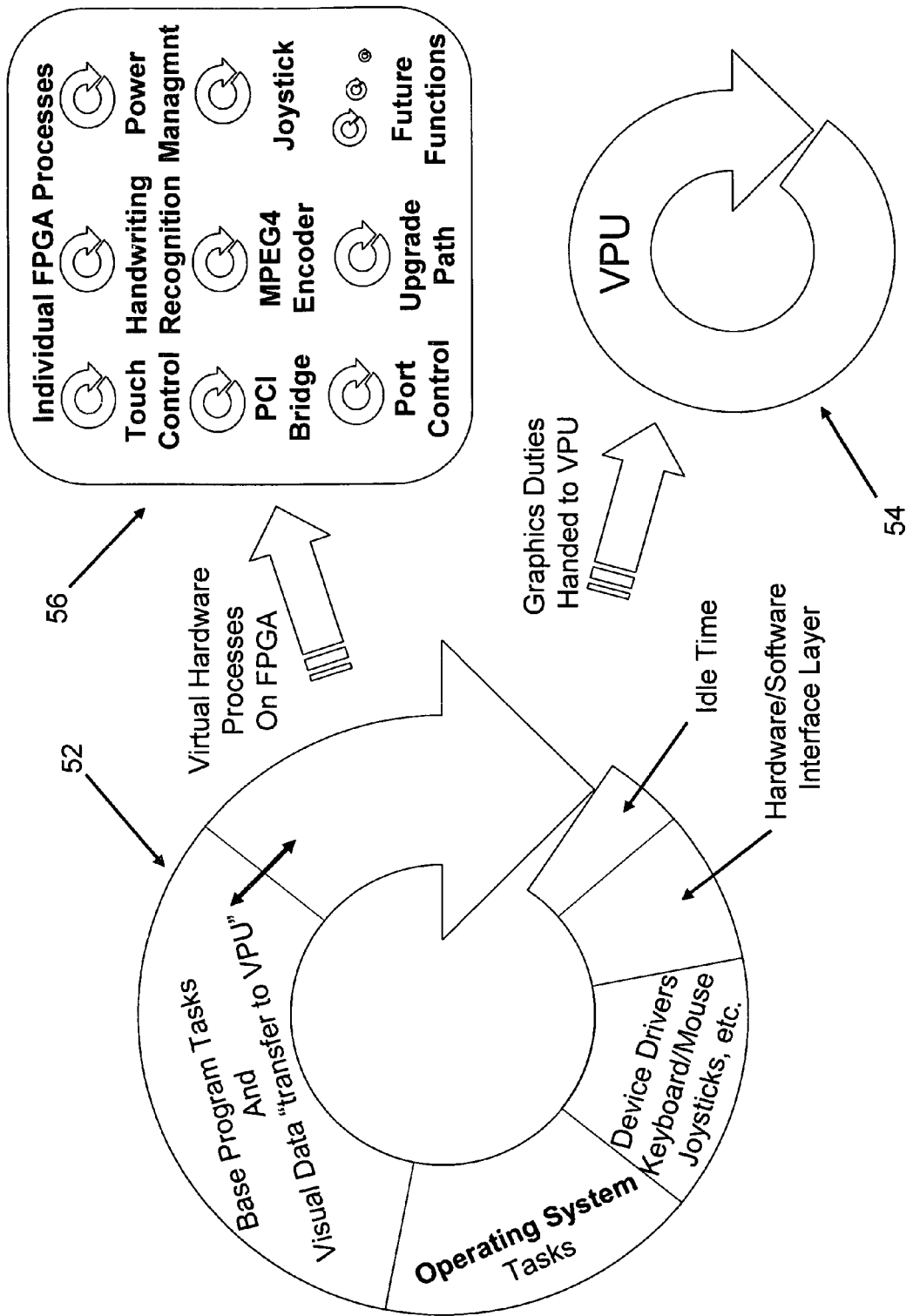
FIG. 6 is an illustration of a CPU process cycle loop with an associated VPU process cycle loop and an FPGA process cycle array.

FIG. 6 illustrates the parallel processing capabilities of an FPGA. While a CPU 52 and VPU 54 each address individual processes in a sequential, linear fashion, the FPGA 56 with its reconfigured circuitry can handle multiple processes simultaneously. In a conventional PC system, a PCI expansion port allows additional circuit boards to be added with additional hardware functions to increase the capacity of the main system. The same additional hardware functions may be added to a PC configured to include an FPGA as shown and described herein without the need to add additional physical hardware to the system. The more processes that are configured into the gate logic of the FPGA, the more system resources are available for application processes. There are non-limiting examples of a number of additional functions listed in FIG. 6. Also contemplated for passing to the FPGA for processing specifically for handheld gaming systems are programmable button control and port management and port muxing functions.

With reference again to FIG. 5, an FPGA 22 may be encoded with a custom interface and PCI or PCIE bridge coding that allows new capabilities to be downloaded and installed and connected through the bridge 24. Any I/O unique to the function that requires specialized connectors may be added to a special connector port or "users port" with a specialized adapter. Depending on what unique function is needed, some analog circuit may be included with the adapter. However, a significant majority if not all of the processing will be done inside the FPGA 22. The PC operating system communicates with the new functions just as if there was a new circuit card present and plugged into one of the PCI or PCIE ports. The same can be done via USB, PCMCIA, or a host of other interconnect methods simply by first routing those control signals to the FPGA. Each function may run completely independent of the other functions configured into the FPGA and connect to the rest of the PC through ordinary ports.

Once the state machine or function block is downloaded and configured in the FPGA, a special driver may be installed on the operating system allowing the operating system to communicate with the new function inside the FPGA just as if a card were inserted into a peripheral interconnect in a traditional PC. Although in the present example, there is no circuit card. Depending upon the device configured into the FPGA logic, the virtual hardware will show up in the System Device Manager just as if a physical circuit card had been added.

Although the implementations shown and described in this disclosure would be useful when building a PC to enable increased hardware functionality at a lower cost with less labor time, particular implementations of the system and methods are intended for hardware upgrades and additions after the PC is sold to the end user. Although the FPGA is finite in capacity, it may be originally shipped in the PC with most of its resources available for future upgrades and/or additional parallel tasks. Through use of a fast I/O structure and unused logic space on the FPGA, the FPGA can later be upgraded by the end user to communicate with devices that are more advanced than the devices available when the PC was built, yet flexible enough to change and adapt as the new devices become available.

Figure 7:
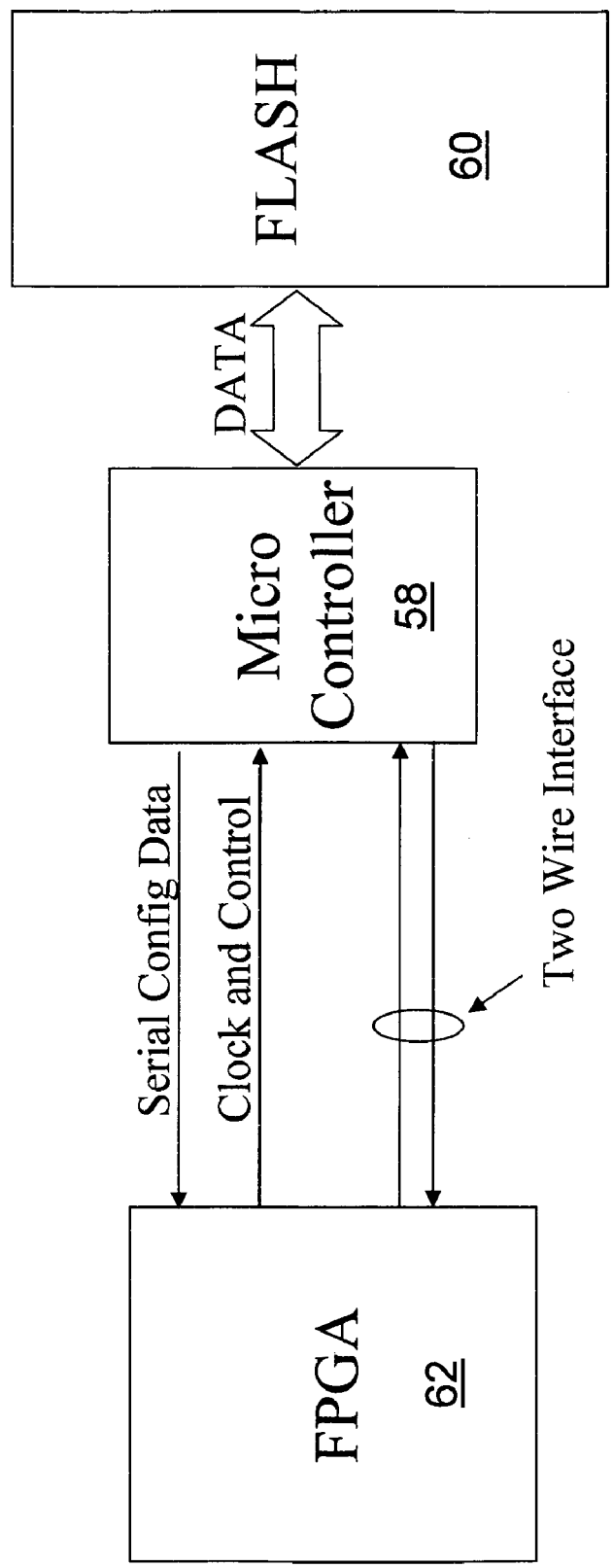
FIG. 7 is a block diagram of an FPGA reconfiguration circuit.

FIG. 7 is a block diagram of a simple circuit for reconfiguring the logic gates of the FPGA. Two of the most commonly used types of FPGA are Flash-based FPGAs and volatile SRAM-based FPGAs. Generally, an SRAM-based FPGA are the fastest and would be expected to be the most successful for this type of design approach. However, to enable the simplest end user reconfigurations to the FPGAs, flash-based FPGAs are used in particular configurations. Thus, rather than using the traditional programmable read only memory ("PROM") or erasable PROM ("EPROM") configuration memory associated with static random access memory ("SRAM") based FPGAs, particular implementations of the circuits described herein employ a microcontroller 58 associated with flash memory 60 to store FPGA configuration files. The configuration files can be changed through a simple communication interface between the microcontroller and the FPGA 62. Once the microcontroller 58 has a new configuration stored in its flash memory 60, it can initiate a "reprogram" or "reconfigure" of the FPGA 62. Following a reconfigure, a confirmation check may be run to confirm that the new functions are operating appropriately. Each new configuration file may contain certain base functions, such as the communications interface to the microcontroller 58 and any special state machines needed to allow the FPGA 62 to communicate to the main board through one of its peripheral interconnects. This allows for additional changes to be made later and to maintain regular duties that may have been handed over to the FPGA 62 by the CPU. Through the ability to instantly upgrade a personal computer for compatibility with new hardware or simply to operate more efficiently with existing software, the use of end user reconfigurable programmable devices enables hardware development to continue long after the product is shipped to the end user.

Figure 8:
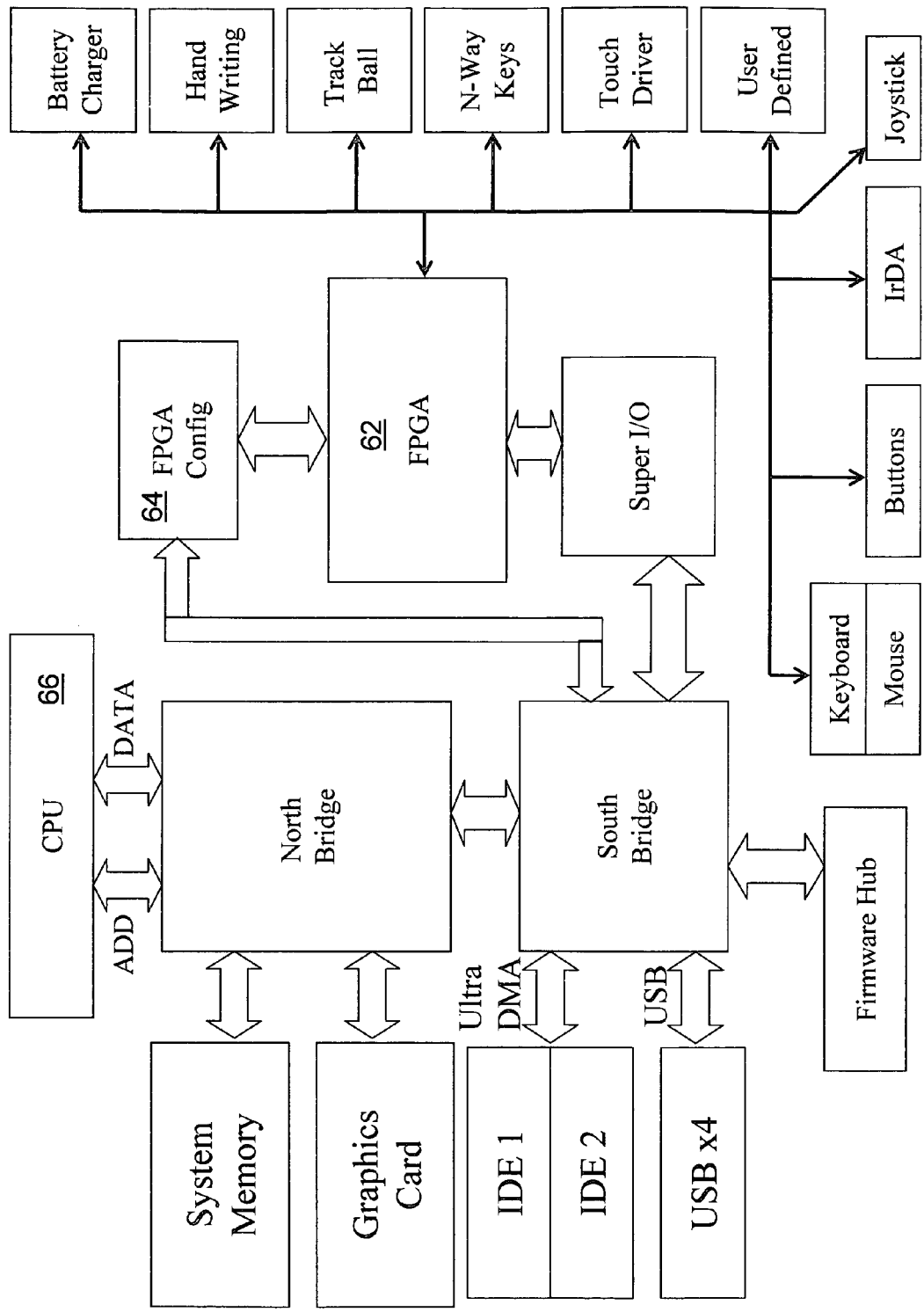
FIG. 8 is a block diagram of an implementation of a personal computer coupled with a reconfigurable FPGA.

FIG. 8 illustrates one example of how the FPGA configuration circuit 64, comprising the microcontroller 58 and flash memory 60, may be implemented. The FPGA configuration circuit 64 may be configured with the capacity, for example, to store two complete FPGA configuration files. Just after power-up of the PC system, the FPGA configuration circuit 64 may configure the FPGA 62 with one of those two configuration files. In a specific implementation of an FPGA 62, the FPGA functions are controlled through a specialized block in the FPGA called a port bridge. The port bridge bridges a function to a PCI port, USB port or even a serial port or any other port available on a PC. The port bridge is a special state machine or logic program which connects the specialized function inside the FPGA, for example a Firewire interface, an MPEG4 encoder/decoder, a system manager, etc., to the personal computer's operating system. In a particular implementation, the system manager could handle configuration updates for the FPGA.

With reference to FIGS. 7 and 8, the system manager function in an FPGA 62 may communicate with the microcontroller 58 through a two-wire serial interface between the two devices. The CPU 66 retrieves the logic configuration instructions ("firmware") through normal PC methods of data retrieval as a binary bit stream. A special program that runs on the operating system as any normal utility or application program may communicate with the FPGA 62 through the appropriate port and the firmware may be passed down to the FPGA 62. The FPGA 62 passes the data that is to become the new configuration file to the microcontroller 58 through the two-wire interface and the microcontroller 58 in turn stores the firmware to flash memory 60. The two-wire interface may also handle the passing of commands from the FPGA 62 to the microcontroller 58 telling it when to start a reconfiguration session. After the microcontroller 58 has reconfigured the FPGA, the FPGA may send health and status information for the new configuration. If the new configuration is faulty, the original configuration file can be programmed in again. Using flash memory large enough to store at least two configuration files is desirable for this purpose. This helps as a fail-safe in case the first attempt fails since the FPGA may be used to transfer the configuration firmware from the PC to the flash memory.

By using Flash-based FPGAs, a more automated approach to allowing the end user to download a configuration file to the memory and automatically reconfigure the FPGA in the same manner a consumer might download and install a new piece of software for their home or office computer. In fact, other than the firmware reconfiguring the logic gates of the FPGA as opposed to copying the software code to a hard drive, to the end user the process may appear on the surface to be identical to a typical software download.

In a specific example of how an FPGA may be upgraded with virtual hardware by the end user, an end user owns a personal computer in the form of a handheld gaming system that includes an ATA 133 hard drive with 133 MB/sec data rate. Over time, however, a newer ATA 166 hard drive with 166 MB/sec data rate is released with 20% faster data rate. The end user purchases, either from a store in the form of a CD or DVD, or through a download, the appropriate firmware to reconfigure the FPGA board circuitry. The firmware is stored in flash memory and used to reconfigure the logic gates of the FPGA to enable the faster data speeds on the handheld gaming system without the need to replace the actual hardware.

Some functions inside the FPGA may be process autonomous. In other words, the CPU will pass information that needs to be processed directly to the FPGA through one of the ports connected to it, such as the PCI port. A special function in the FPGA may process that data and send it right back to the CPU. An example of this is a logic implemented MPEG4 Encoder/Decoder. In this sense, there is no need to pass data out any port connected to the FPGA. The function simply involves internal data and the FPGA simply acts as an internal data handler that appears to the CPU as a stand alone circuit card assembly.

Figure 9C:
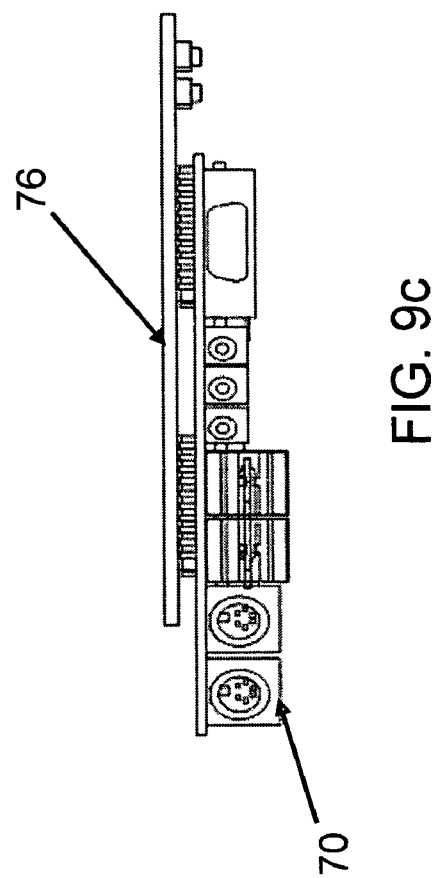
FIG. 9c is an end view of a port module connected to the connector board of FIG. 9b.
Figure 9A:
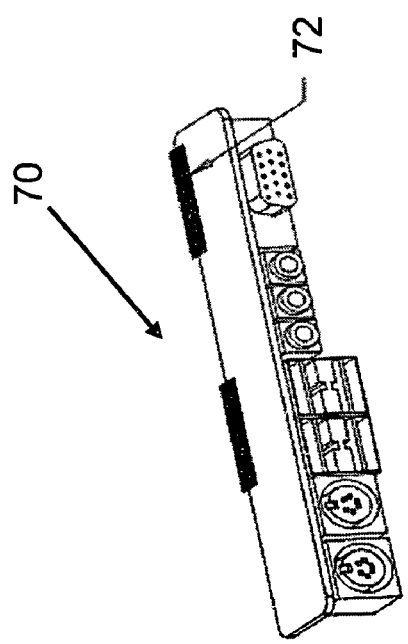
FIG. 9a is a perspective view of an implementation of a port module.
Figure 9B:
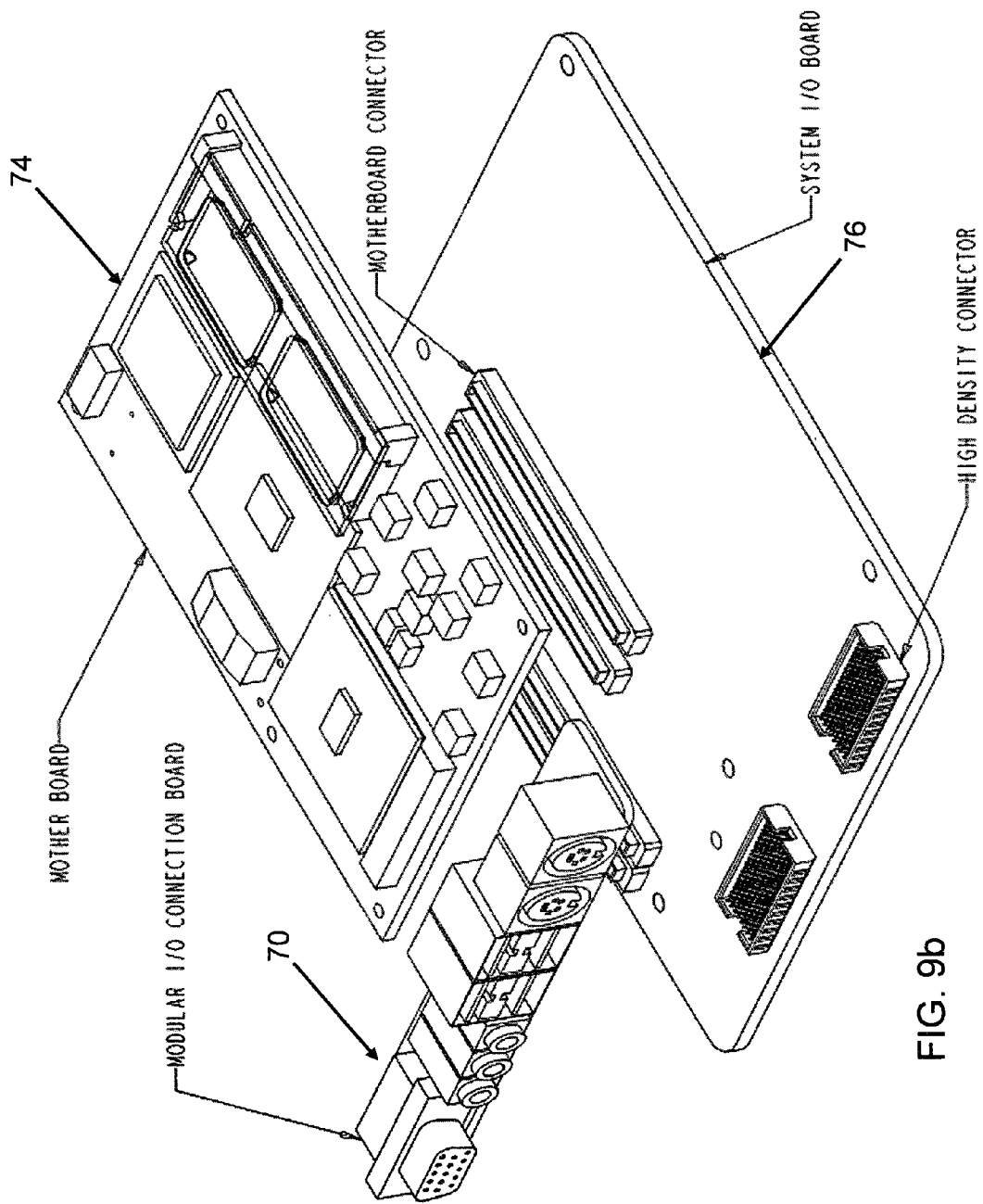
FIG. 9b is an exploded perspective view of a port module in relation to a motherboard and associated connector board.

However, many functions may require some type of external interface. Since the FPGA is free to implement a number of port protocols and port functions depending on end user needs and desires, a flexible connector port is also desirable. One example of a port module associated with an FPGA and motherboard is shown in FIGS. 9a, 9b and 9c. FIG. 9a is a perspective view of an underside of an implementation of a port module 70 showing the high density connectors 72 associated with each of the port connectors. FIG. 9b is an exploded perspective view of the port module 70 of FIG. 9a in relation to a motherboard 74 and associated connector board 76. Note the high density connectors 78 on the connector board 76 to couple with the high density connectors 72 of the port module 70. FIG. 9c is an end view of a port module 70 connected to the connector board 76 of FIG. 9b. In this particular implementation, the FPGA may be mounted on the motherboard 74, mounted to the connector board 76, or mounted to a separate board and coupled to either the motherboard 74 or the connector board 76. Other port modules of varying configurations depending upon the end user's needs are anticipated.

Figure 10:
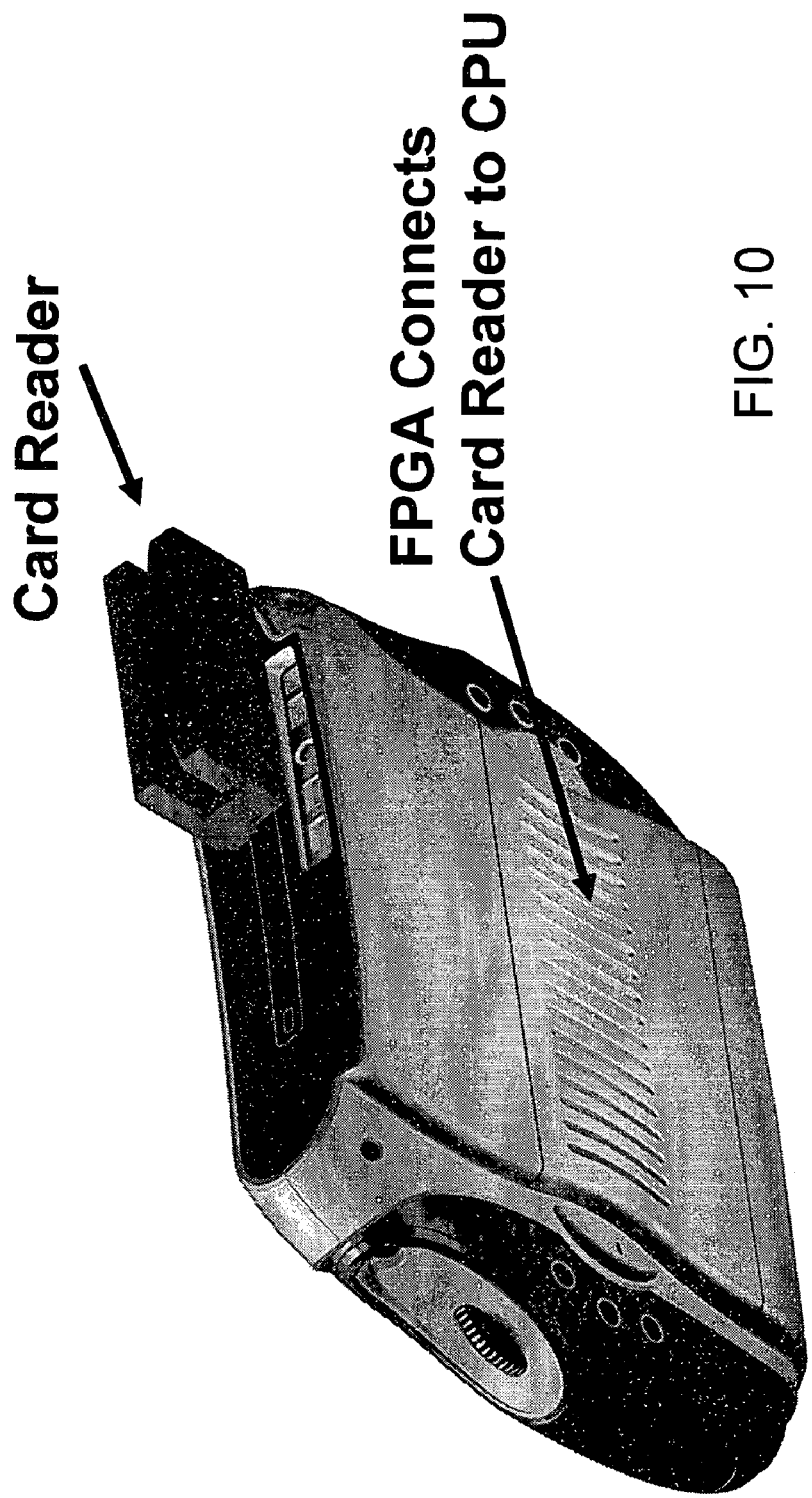
FIG. 10 is a perspective view of a personal computer with a card reader coupled to a port associated with an FPGA.

A port module may house the unique connector needed for any particular port function, such as an RJ-45 connector for Ethernet. If any analog circuitry unique to a particular interface is necessary, it may also be included as part of the port module. For instance, where a standard serial port is needed, the connector module may contain the RS-232 protocol chip as well as the DB-9 connector. The port modules may be implemented in sets, or individually. The port module configuration may be entirely end user definable so that the user builds a set of ports desired for use by the end user depending upon which virtual hardware the end user has loaded onto the FPGA of a personal computer. The user interface ports are determined by the maximum number of General Purpose I/O lines connected from the FPGA to this module (for example there could be 45). One user could implement a 3 USB and 2 serial ports module, where another user could implement a 4 USB and 1 Firewire port module different from the first port module and first FPGA configuration. Application specific port modules can also add function that might normally be seen only as an attachment, such as a smart card reader or a magnetic stripe reader. FIG. 10 illustrates one example of a card reader coupled to a port on a tablet PC. The FPGA essentially connects these additional devices to the CPU. There is also no inherent requirement that the port modules come in large sets. A particular port module, for example, may include only a single or perhaps two ports. One of the benefits of this kind of system is that the peripheral component designer and the end user have significant flexibility for implementing the desired combination.

Figure 11:
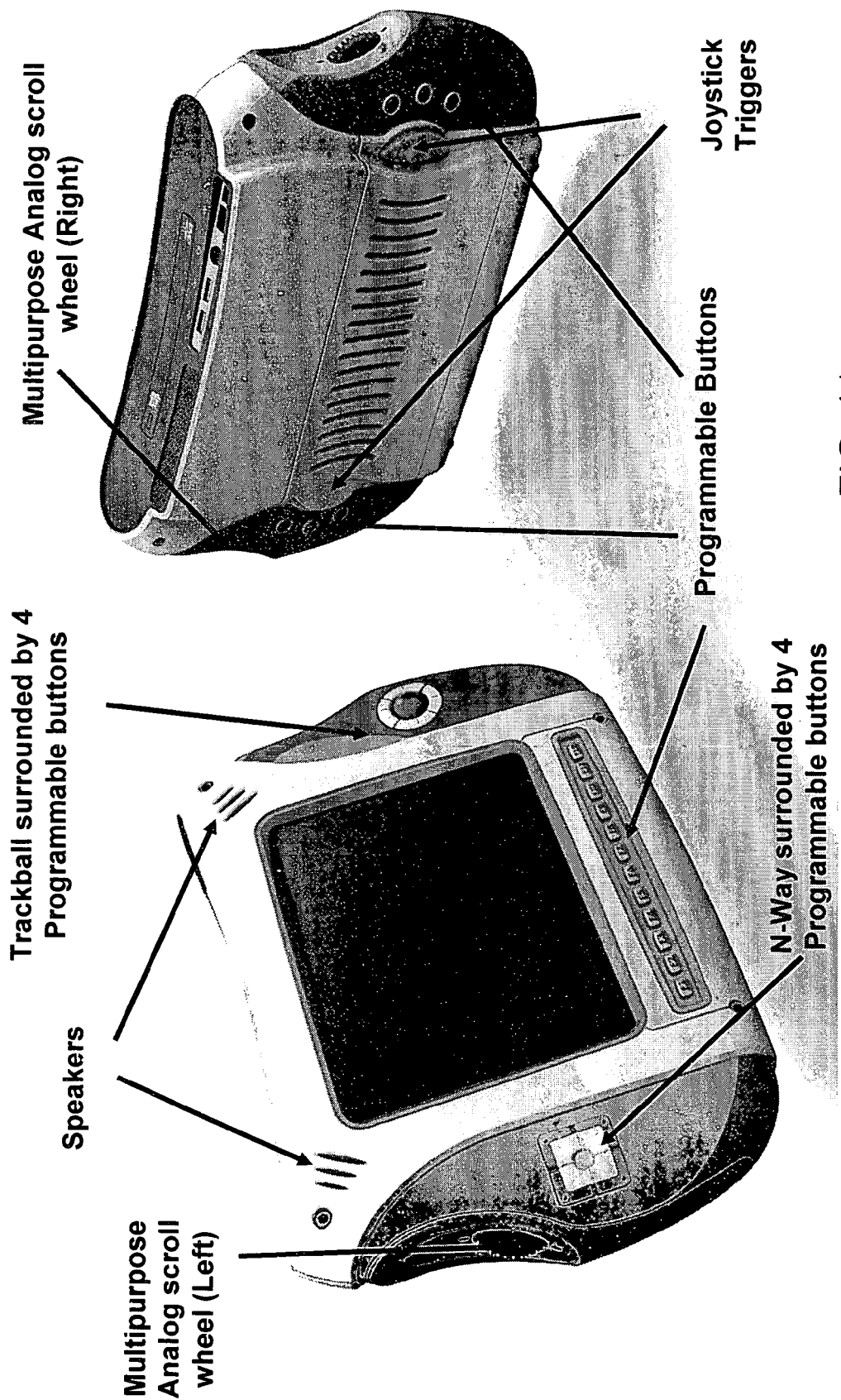
FIG. 11 is front and back perspective views of a handheld game system.
Figure 12:
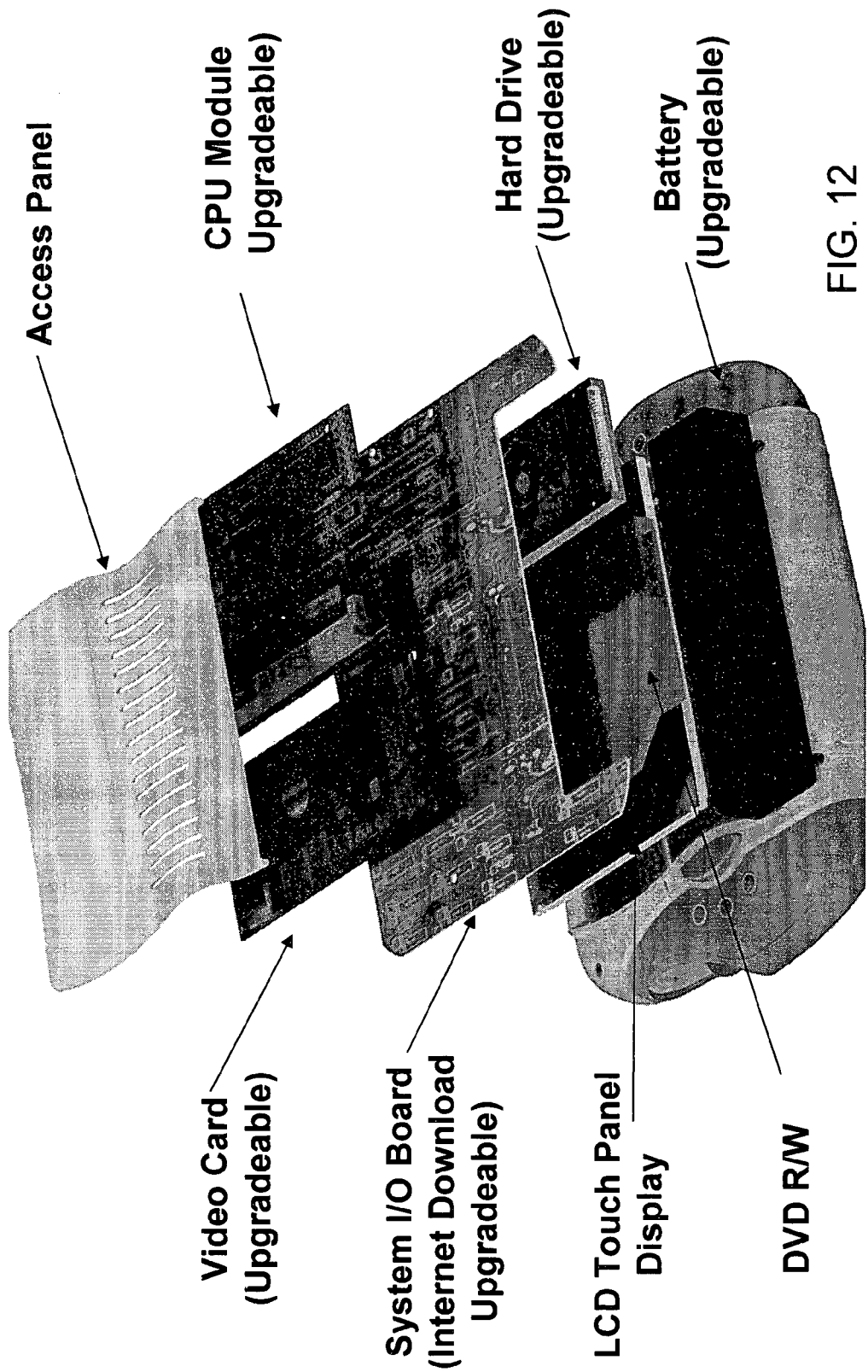
FIG. 12 is an exploded view of the handheld game system of FIG. 11.

FIG. 11 is a front perspective view of a particular implementation of a personal computer as a handheld game system with an FPGA closely associated with the CPU of the computer. FIG. 12 is a back perspective view of the handheld game system of FIG. 11. FIG. 13 is an exploded view of the handheld game system of FIG. 11. Various components of the handheld game system are identified on the Figures as part of the drawings and in accordance with the aspects discussed in this disclosure.

The aspects, implementations and examples set forth in this disclosure were presented in order to explain some practical applications of a personal computer with virtual hardware capabilities to thereby enable those of ordinary skill in the art to make and use a personal computer having the advantages disclosed herein. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A microcontroller-based system comprising:
a FPGA having logic gates, said FPGA interfacing with a chipset of a CPU within the system; and
a microcontroller and memory within the system and associated with the FPGA,
wherein the microcontroller and memory coordinate to receive and store end user initiated firmware capable of automatically reconfiguring the configuration of said logic gates within the FPGA;
wherein the FPGA is upgradable through activation of the microcontroller to reconfigure the FPGA according to the firmware stored in the memory and wherein the FPGA is configurable to be an input and output signal interface to the system; a coprocessor; a manual input interface controller; a visual display output controller; a signal processor; a communications protocol controller and a battery charger.

2. The system of claim 1, further comprising at least one generic port coupled to the FPGA and configured to receive a first adapter configured to couple to said generic port and to at least a first electronic device.

3. The system of claim 2, wherein the at least one generic port is further configured to couple to a second adapter different than the first adapter, the second adapter configured to couple to the generic port and to at least a second electronic device.

4. The system of claim 1, wherein the microcontroller is configured to download said user initiated firmware to memory from a drive associated with the system.

5. The system of claim 1, wherein the microcontroller is configured to download the firmware to memory from an Internet connection associated with the system.

6. The system of claim 1, wherein the FPGA is on the motherboard of the system.

7. The system of claim 1, wherein the FPGA is on a circuit board separate from the motherboard and is coupled to the motherboard through a peripheral computer interconnect.

8. The system of claim 1, wherein the FPGA is upgradable by the end user to add a plurality of different additional hardware functionality through the end user downloading desired additional firmware programs to the memory and reconfiguring the FPGA according to each of the additional firmware programs.

9. The system of claim 1, wherein the handheld gaming system further comprises a touch screen display.

10. A personal computer comprising:
a FPGA on a motherboard of a personal computer or connected to interfacing with a chipset of a CPU within the personal computer; and
a microcontroller and memory within the personal computer and associated with the FPGA, wherein the microcontroller and memory coordinate to store firmware that when activated by an end user automatically changes the configuration of the logic gates within the FPGA and increases the hardware functionality of the FPGA;
wherein the FPGA is upgradable by the end user of the personal computer through activation of the firmware through the microcontroller to reconfigure the FPGA according to the firmware stored in the memory to be an input and output signal interface to the system; a coprocessor; a manual input interface controller; a visual display output controller; a signal processor; a communications protocol controller and a battery charger.

11. The personal computer of claim 10, wherein the personal computer is a handheld gaming system.

12. The personal computer of claim 10, further comprising at least one generic port coupled to the FPGA and configured to receive a first adapter configured to couple to the generic port and to at least a first electronic device.

13. The personal computer of claim 12, wherein the at least one generic port is further configured to couple to a second adapter different than the first adapter, the second adapter configured to couple to the generic port and to at least a second electronic device.

14. The personal computer of claim 10, wherein the microcontroller is configured to download the firmware to memory from a drive associated with the personal computer.

15. The personal computer of claim 10, further comprising a plurality of peripheral devices coupled to the personal computer through the FPGA.

16. The personal computer of claim 10, wherein the FPGA is on the motherboard of the personal computer.

17. The personal computer of claim 10, wherein the FPGA is on a circuit board separate from the motherboard and is coupled to the motherboard through a peripheral computer interconnect.

18. The personal computer of claim of claim 10, wherein the FPGA is upgradable by the end user to add a plurality of different additional hardware functionality through the end user downloading desired additional firmware programs to the memory and reconfiguring the FPGA according to each of the additional firmware programs.

19. A method of upgrading hardware of a personal computer at an end user's location the method comprising:
providing a personal computer owner with firmware configured to automatically change the configuration of the logic gates within an FPGA associated with a CPU of the personal computer;
instructing the personal computer owner to install the firmware onto the FPGA of the personal computer, wherein installation of the firmware onto the FPGA reconfigures at least a portion of the FPGA hardware to enable the personal computer to have additional hardware functionality comprising an input and output signal interface to the system; a coprocessor; a manual input interface controller; a visual display output controller; a signal processor; a communications protocol controller and a battery charger.

20. The method of claim 19, wherein the firmware is a first firmware associated with a first hardware functionality, the method further comprising instructing the personal computer owner to install a second firmware onto the FPGA, wherein installation of the second firmware onto the FPGA reconfigures the FPGA hardware to enable the personal computer to have additional hardware functionality different from that associated with the first firmware installation.

* * * * *